United States Patent
Radosavljevic et al.

(10) Patent No.: US 8,093,584 B2
(45) Date of Patent: Jan. 10, 2012

(54) SELF-ALIGNED REPLACEMENT METAL GATE PROCESS FOR QWFET DEVICES

(75) Inventors: Marko Radosavljevic, Beaverton, OR (US); Benjamin Chu-Kung, Hillsboro, OR (US); Mantu K. Hudait, Portland, OR (US); Ravi Pillarisetty, Portland, OR (US)

(73) Assignee: Intel Corporation, Santa Clara, CA (US)

(*) Notice: Subject to any disclaimer, the term of this patent is extended or adjusted under 35 U.S.C. 154(b) by 270 days.

(21) Appl. No.: 12/317,468

(22) Filed: Dec. 23, 2008

(65) Prior Publication Data

US 2010/0155701 A1 Jun. 24, 2010

(51) Int. Cl.
*H01L 29/12* (2006.01)
*H01L 29/68* (2006.01)
*H01L 29/78* (2006.01)

(52) U.S. Cl. ......... 257/24; 257/E29.069; 257/E29.168; 257/E29.255

(58) Field of Classification Search ............ 257/24, 257/E29.069, E29.168, E29.255
See application file for complete search history.

(56) References Cited

U.S. PATENT DOCUMENTS

| | | | | |
|---|---|---|---|---|
| 5,336,904 A | * | 8/1994 | Kusunoki | 257/23 |
| 5,343,057 A | * | 8/1994 | Gerard et al. | 257/192 |
| 5,550,388 A | * | 8/1996 | Haruyama | 257/24 |
| 6,770,902 B2 | * | 8/2004 | Phillips | 257/20 |
| 7,868,318 B2 | * | 1/2011 | Hudait et al. | 257/19 |
| 2007/0138565 A1 | * | 6/2007 | Datta et al. | 257/369 |
| 2008/0142786 A1 | * | 6/2008 | Datta et al. | 257/24 |
| 2009/0242872 A1 | * | 10/2009 | Pillarisetty et al. | 257/14 |
| 2009/0272965 A1 | * | 11/2009 | Rachmady et al. | 257/24 |
| 2009/0321717 A1 | * | 12/2009 | Pillarisetty et al. | 257/24 |
| 2010/0078684 A1 | * | 4/2010 | Rachmady et al. | 257/192 |
| 2010/0148153 A1 | * | 6/2010 | Hudait et al. | 257/24 |

* cited by examiner

*Primary Examiner* — Victor A Mandala
(74) *Attorney, Agent, or Firm* — Rahul D. Engineer

(57) ABSTRACT

A self-aligned replacement metal gate QWFET device comprises a III-V quantum well layer formed on a substrate, a III-V barrier layer formed on the quantum well layer, a III-V etch stop layer formed on the III-V barrier layer, a III-V source extension region formed on the III-V etch stop layer and having a first sidewall, a source region formed on the III-V source extension region and having a second sidewall, a III-V drain extension region formed on the III-V etch stop layer and having a third sidewall, a drain region formed on the III-V drain extension region and having a fourth sidewall, a conformal high-k gate dielectric layer formed on the first, second, third, and fourth sidewalls and on a top surface of the etch stop layer, and a metal layer formed on the high-k gate dielectric layer.

18 Claims, 6 Drawing Sheets

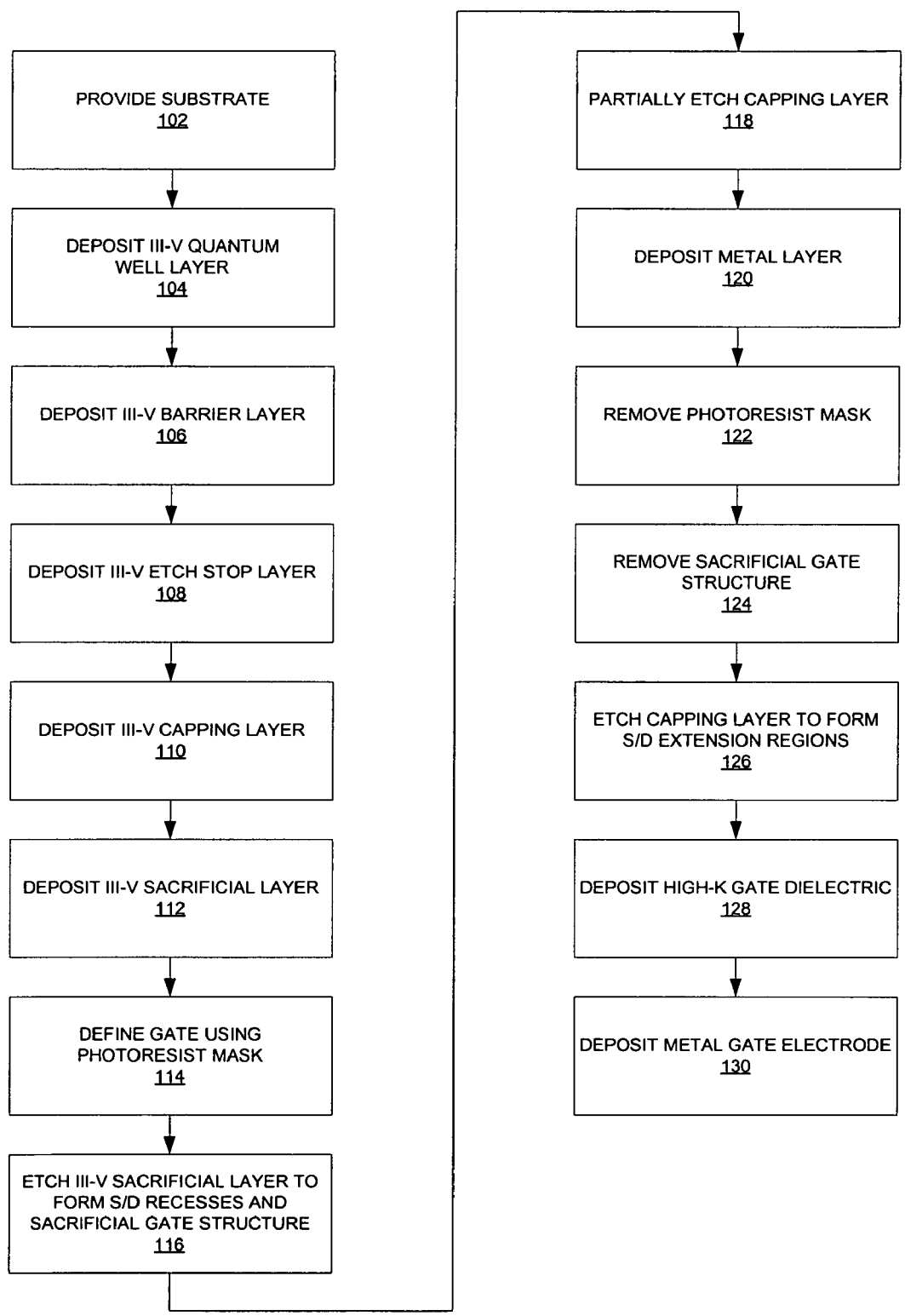
FIG._1

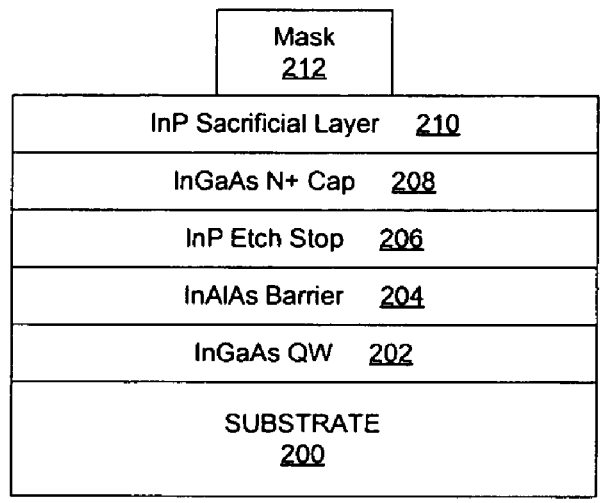
FIG._2A
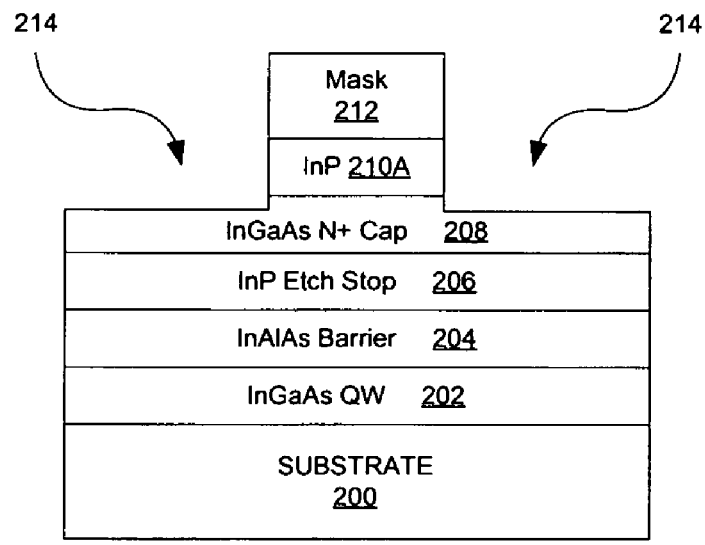
FIG._2B

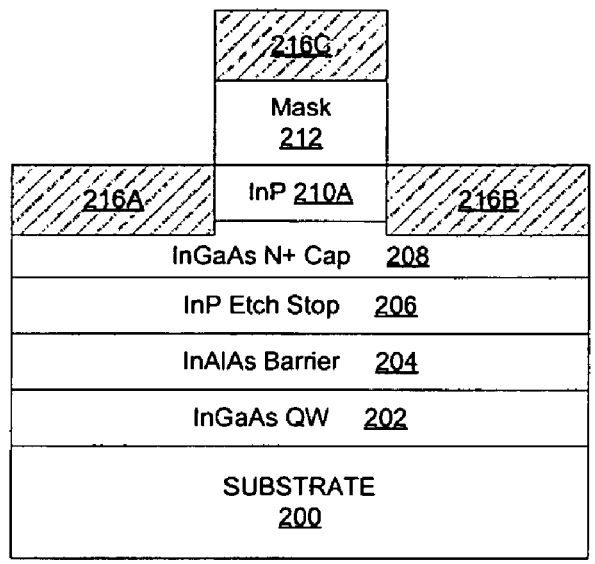
FIG._2C
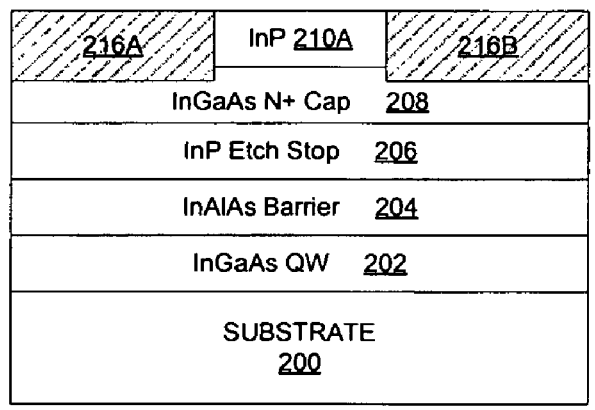
FIG._2D

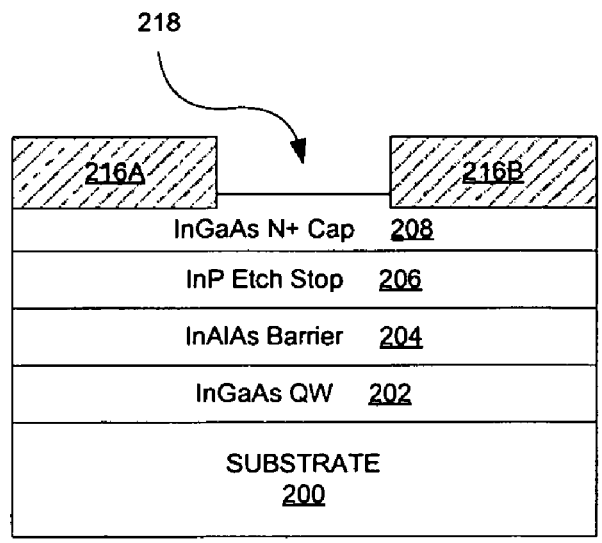
FIG._2E
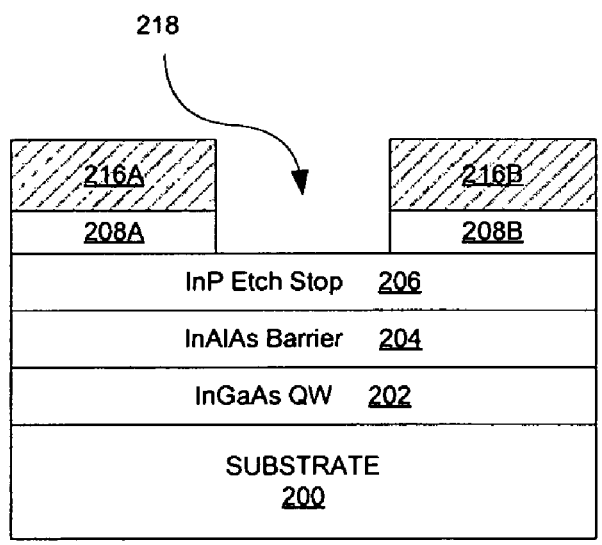
FIG._2F

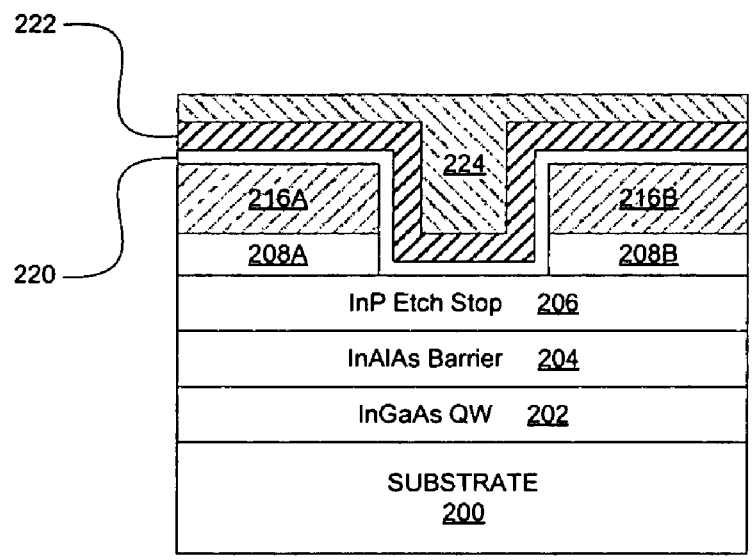
FIG._2G
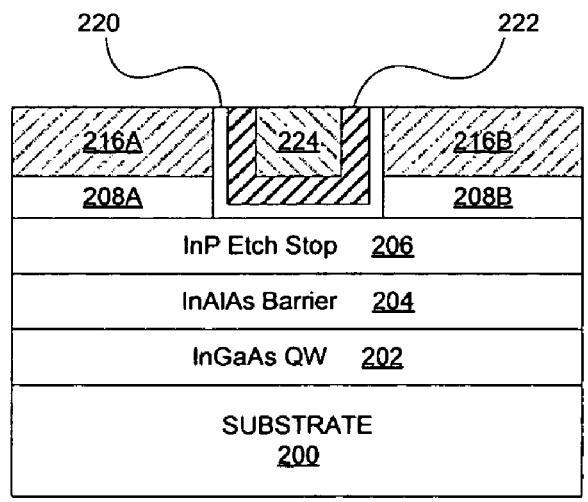
FIG._2H

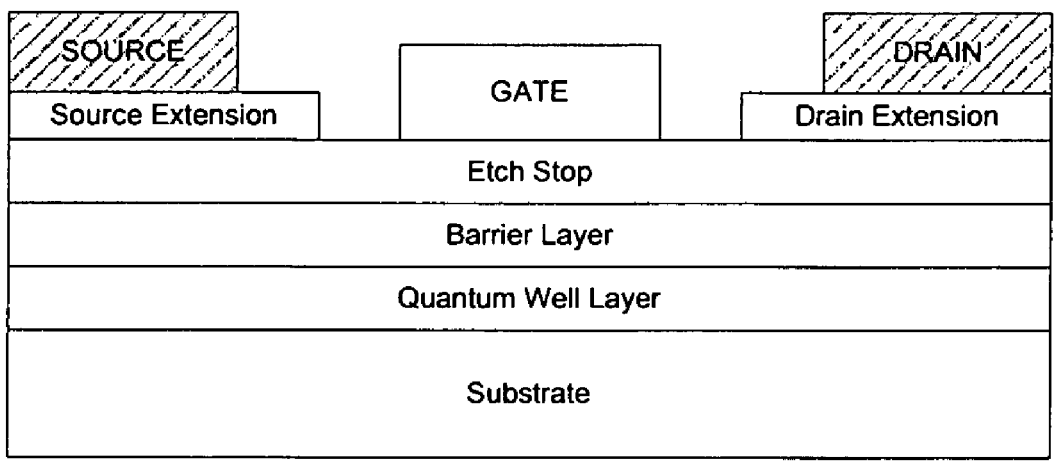
FIG._3 (Prior Art)

SELF-ALIGNED REPLACEMENT METAL GATE PROCESS FOR QWFET DEVICES

BACKGROUND

As integrated circuit technology continues to scale down, energy efficiency becomes increasingly important. To that end, group III-V semiconductor materials have been proposed for use in future generation transistors because of their ability to enable high-speed switching at low supply voltages due to their excellent low and high-field electron transport properties. Group III-V materials are synthesized using elements from the 3rd and the 5th group of the periodic table, examples include gallium arsenide (GaAs), indium gallium arsenide (InGaAs), gallium phosphide (GaP), gallium nitride (GaN), gallium aluminum arsenide (GaAlAs), indium aluminum arsenide (InAlAs), indium phosphide (InP), indium arsenide (InAs), and indium antimonide (InSb).

Transistors developed using III-V materials are known as quantum-well field-effect transistors (QWFETs). In a QWFET, the III-V material is used to form a quantum-well channel region for the transistor while the source and drain (S/D) regions are formed using a metal-doped semiconducting material, such as doped silicon or doped germanium. Conventional lithography processes are used to form the gate stack and source/drain regions for the QWFET device. This results in a relatively large distance between the gate electrode and the source/drain regions.

While self-aligned techniques can minimize the distance between the S/D regions and the gate stack, unfortunately, they cannot be used in the fabrication of QWFET devices. This is because conventional self-aligned techniques rely heavily on the use of spacers to define where structures are to be formed. In the fabrication of QWFET devices, however, the spacer material is difficult to form and suffers greatly from etch damage during dry etch steps. As a result, alternate processes are needed to form self-aligned QWFET devices that minimize the distance between the S/D regions and the gate electrode.

BRIEF DESCRIPTION OF THE DRAWINGS

FIG. 1 is a method of forming a quantum well transistor having self-aligned source and drain regions.

FIGS. 2A through 2H illustrate structures that are formed when the method of FIG. 1 is carried out.

FIG. 3 illustrates a prior art quantum well transistor that is formed using a conventional lithographic process.

DETAILED DESCRIPTION

Described herein are systems and methods of forming a self-aligned QWFET device using a replacement metal gate process. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

In accordance with implementations of the invention, a novel III-V quantum well field effect transistor (QWFET) is formed using a replacement metal gate process flow that enables self-aligned source and drain regions. The use of a self-aligned process results in a QWFET device having source and drain regions that are in very close proximity to the gate electrode compared to conventional, non-self-aligned processes. For reference, a conventional, non-self-aligned QWFET is shown in FIG. 3. The novel configuration and process flow disclosed herein reduces the external resistance of the QWFET device. Furthermore, self-aligned devices are necessary to take full advantage of superior transport properties of III-V materials. To date, self-aligned devices have been hard to fabricate due to the inability to form spacer material in a III-V environment due to damage caused by the dry etch processes used.

FIG. 1 is a method 100 of forming a self-aligned QWFET device on a substrate in accordance with an implementation of the invention. FIGS. 2A through 2H illustrate structures that are formed when the method of FIG. 1 is carried out.

The method 100 begins by providing a substrate upon which the III-V film will be grown (102 of FIG. 1). The substrate is generally a semiconductor substrate and may be formed from known semiconductor materials, such as silicon or silicon-containing materials, germanium or germanium-containing materials, or other group IV containing materials.

In some implementations the substrate may be formed from, or include, a III-V material such as GaAs, GaP, GaN, GaAlAs, InAlAs, InP, and InAs. As will be explained below, a relatively wide bandgap III-V material may be used as the substrate to provide a barrier for the subsequently formed high-mobility quantum well layer. In some implementations, a layer of III-V material, such as InAlAs, may be formed as the top surface of the substrate. In further implementations, the semiconductor substrate may be doped in situ, for instance, the substrate may be P-doped in situ in order to form an N-type (NMOS) QWFET or it may be N-doped in situ to form a P-type (PMOS) QWFET. In some implementations, the barrier layer may be counter-doped relative to the quantum well layer to mitigate short channel effects.

In further implementations, the substrate may be formed using one or more layers that include any combination of silicon, silicon-containing materials, germanium, germanium-containing materials, other group IV containing materials, and III-V materials such as GaAs, GaP, GaN, GaAlAs, InAlAs, InP, and InAs.

FIG. 2A illustrates a substrate 200 that may serve as a foundation for the fabrication of a III-V QWFET device.

Next, a III-V layer is deposited on the substrate for use as a high-mobility quantum well layer (104). The quantum well layer functions as the channel region in the III-V quantum well transistor. A relatively narrow bandgap III-V material is typically used as the quantum-well layer. In an implementation, a III-V material such as indium gallium arsenide (InGaAs) or indium antimonide (InSb) may be used to form the quantum well layer. Alternate materials that may be used for the quantum well layer include, but are not limited to, inidium alloys, gallium alloys, arsenic alloys, antimony alloys, InGaSb, InAs, and InAsSb. The thickness of the quantum layer may range from one Angstrom (Å) to 100 Å.

Several different epitaxial processes may be employed to deposit the III-V quantum well layer on the substrate. In some implementations, the epitaxial film growth may be carried out using a molecular beam epitaxy (MBE) process, an electron beam (e-beam) deposition process, a metalorganic chemical vapor deposition (MOCVD) process, a metalorganic vapor phase epitaxy (MOVPE) process, or a pulsed laser deposition (PLD) process. Alternate deposition methods may also be employed, as will be appreciated by those of ordinary skill in the art.

FIG. 2A illustrates an InGaAs quantum well layer 202 formed on the substrate 200 that may serve as a channel region in the III-V quantum well transistor.

A second III-V layer is then deposited for use as a barrier layer (106). The second III-V layer is formed atop the III-V quantum well layer. The barrier layer serves as a transition between the quantum well layer and additional III-V layers or a gate dielectric layer that are formed above the quantum well layer. More importantly, the barrier layer is used to confine the carriers (e.g., electrons or holes) to the quantum well layer. A relatively wide bandgap III-V material is used as the barrier layer. The wide bandgap ensures that the carriers remain confined in the narrow bandgap quantum well layer. The use of a wide bandgap III-V material also reduces junction leakage and transistor off-state leakage. In implementations of the invention, III-V materials such as GaAs, GaP, GaN, GaAlAs, InAlAs, and InP may be used as the barrier layer. In further implementations, the barrier layer may be counter-doped relative to the quantum well layer to mitigate short channel effects. For instance, the barrier layer may be p-doped if the quantum well layer is n-type or vice versa. The thickness of the III-V barrier layer may range from 1 Å to 100 Å.

Again, several different epitaxial processes may be employed to grow the III-V barrier layer on the quantum well layer. In some implementations, the epitaxial film growth may be carried out using an MBE process, an e-beam process, an MOCVD process, an MOVPE process, or a PLD process. Alternate deposition methods may also be employed, as will be appreciated by those of ordinary skill in the art.

FIG. 2A illustrates an InAlAs barrier layer 204 formed atop the III-V quantum-well layer 202.

An III-V etch stop layer is then deposited on the barrier layer (108). The III-V etch stop layer serves to protect the underlying barrier and quantum well layers during the etching processes that subsequently form the source region, the drain region, and the gate stack (e.g., the gate dielectric and the gate electrode). The III-V etch stop layer also serves the conventional purpose of providing an endpoint indicator for the above-mentioned etching processes. A III-V material may be used for compatibility purposes (lattice matched) with the underlying barrier layer. In some implementations, the specific III-V material used in the etch stop may be chosen based on compatibility with the material used in the underlying barrier layer and/or based on the etchant used during fabrication of the source/drain regions and the gate stack (i.e., the etchant should be selective to the material used in the etch stop layer). In some implementations, a III-V material such as InP may be used atop a InAlAs barrier layer. In other implementations, alternate III-V materials may be used, including but not limited to GaAs, GaP, GaN, GaAlAs, and InAlAs. The thickness of the III-V etch stop layer may range from 1 Å to 100 Å.

The same epitaxial processes described above may be used to form the III-V etch stop layer. FIG. 2A illustrates an InP etch stop layer 206 formed atop the III-V barrier layer 204.

In alternate implementations of the invention, the III-V etch stop layer may be entirely omitted. In such an implementation, the III-V barrier layer may carry out the functions of both the barrier layer and the etch stop layer. If necessary, the barrier layer may be formed at a greater thickness, may be formed of alternate materials, or may be a graded or composite material that includes III-V materials suitable for use in barrier layers and in etch stop layers. For example, the III-V barrier layer may be a graded or laminate layer that substantially consists of: a) InAlAs adjacent to the III-V quantum well layer, b) a mixture of InAlAs and InP in a middle region, and c) InP adjacent to a III-V capping layer that is described in the following paragraph. As will be appreciated by those of skill in the art, materials other than InAlAs and InP may be used in such a graded or laminate barrier layer.

Next, a III-V capping layer is deposited atop the etch stop layer (110). The III-V capping layer functions as a source extension and a drain extension for the source and drain regions. Accordingly, if the QWFET being formed is an N-type transistor (i.e., an NMOS transistor), the capping layer may be N+ doped. In an alternate implementation, if the QWFET is a PMOS, then the capping layer may be a P+ doped layer. In the examples provided herein, the QWFET is an NMOS device and the capping layer is an N+ doped capping layer. The capping layer may be formed using a high mobility, narrow bandgap III-V material that is compatible with the underlying etch stop layer. In some implementations, the III-V capping layer may be formed using N+ doped InGaAs. In other implementations, alternate III-V materials such as InSb may be used. The thickness of the III-V capping layer may range from 1 Å to 500 Å.

The same epitaxial processes described above may be used to form the III-V capping layer. FIG. 2A illustrates an InGaAs capping layer 208 formed atop the III-V etch stop layer 206.

Finally, a III-V sacrificial layer may be deposited on the III-V capping layer (112). The sacrificial layer is used to absorb etch damage caused by a subsequent replacement metal gate (RMG) process that includes self-aligned source and drain regions. The sacrificial layer is also used as a sacrificial gate structure for the RMG process. The sacrificial layer may be formed from a III-V material that is compatible with the underlying capping layer (i.e., lattice matched) and that is suitable for use as a sacrificial layer. For instance, in one implementation, InP may be used as the sacrificial layer. The thickness of the III-V sacrificial layer may range from 1 Å to 100 Å.

The same epitaxial processes described above may be used to form the III-V sacrificial layer. FIG. 2A illustrates an InP sacrificial layer 210 formed atop the III-V capping layer 208.

In alternate implementations of the invention, one or more additional III-V layers may be included in conjunction with the III-V layers described above. These additional III-V layers may be used for many purposes, including but not limited to providing transition layers, buffer layers, further barrier layers, and further channeling layers.

Once the III-V stack is complete, a replacement metal gate process that includes self-aligned source and drain regions may be carried out. First, the location of the gate electrode (or gate stack) is defined using conventional lithography methods (114). For instance, a photolithography process may be used to form a photoresist mask atop the III-V sacrificial layer that defines the location of the gate electrode for the QWFET device being fabricated.

Photolithography processes are well known in the art. A conventional photolithography process may include depositing a photoresist material onto the III-V sacrificial layer, exposing the photoresist material to ultraviolet radiation or extreme ultraviolet radiation through a patterned optical mask, and developing the photoresist material. Photoresist material that remains after development functions as a photoresist mask allowing only selected portions of the sacrificial layer to be exposed and etched, thereby defining structures such as the gate electrode. For example, the portion of the sacrificial layer below the photoresist mask defines the location of the gate electrode for the QWFET device.

FIG. 2A illustrates a photoresist mask 212 formed atop the III-V sacrificial layer 210. The photoresist mask 212 defines the gate electrode that is subsequently formed by the RMG process.

Next, an etching process is applied to remove exposed portions of the sacrificial layer and form recesses that define where the source and drain regions are formed (116). In one implementation, a dry etch process appropriate for InP may be applied. In further implementations, another etching process may be used including but not limited to a reactive ion etching (RIE) or a wet etch process. The specific etching process chosen will generally be based on which III-V materials are used in the sacrificial layer and the capping layer. The portion of the sacrificial layer that remains after the source and drain recess etch functions as a sacrificial gate structure.

Once the etching process is end-pointed on the III-V capping layer, a second, shorter etching process may be carried out to partially etch the capping layer and remove a portion of its top layer to clean up any damage caused by the etching of the sacrificial layer (118). This second etching process may be a wet etch process or a dry etch process that is applicable to the material used in the capping layer, such as the InGaAs.

FIG. 2B illustrates source and drain recesses 214 that have been formed in the sacrificial layer 210. Also, as shown, a top portion of the capping layer 208 has been removed by the second etch. The remaining portion of the sacrificial layer 210 will function as a sacrificial gate structure 210A for the RMG process.

The source and drain regions are then formed in the recesses using a metal deposition process (120). In one implementation, a physical vapor deposition (PVD) process may be used to deposit a blanket layer of metal over the substrate. The metal fills the recesses formed in the sacrificial layer to form the source and drain regions. Accordingly, the source and drain regions are self-aligned to the photoresist mask and the sacrificial gate structure. In alternate implementations, metal deposition processes such as chemical vapor deposition (CVD), atomic layer deposition (ALD), sputtering, electroplating, and electroless plating may be used. Any low resistivity metals may be used here to form the source and drain regions, including but not limited to copper, aluminum, nickel, and TiW.

FIG. 2C illustrates the deposition of a blanket metal layer 216 atop the substrate. Portions 216A/216B of the blanket metal layer are formed within the source and drain recesses 214. These portions 216A/216B provide the source and drain regions of the QWFET device of the invention. Another portion 216C of the blanket metal layer 216 is formed outside the source and drain recesses 214. This portion 216C is subsequently removed.

The photoresist mask may be removed at this stage of the process (122). In one implementation, an acetone lift-off process may be used to remove the photoresist mask. The overlying metal layer will lift-off with the photoresist material. As such, any excess metal outside the source and drain regions is removed during this process.

FIG. 2D illustrates removal of the photoresist mask 212, leaving behind only the metal 216 that is formed in the source and drain recesses. The portion 218C of the metal layer that was outside the source and drain recesses 214 has now been removed.

With the photoresist mask removed, the replacement metal gate process may continue. The sacrificial gate structure may be removed using an etching process (124). In one implementation, a wet etch process using hydrochloric acid may be applied as this has been shown to etch InP selectively to InGaAs. In further implementations, alternate etching processes, such as another wet etch or a dry etch that is appropriate for InP (or whichever material is used in the sacrificial gate structure), may be used. Removal of the sacrificial gate structure exposes the III-V capping layer below.

FIG. 2E illustrates a trench 218 that has been formed after the sacrificial gate structure 210A is removed. The underlying capping layer 208 is exposed at this stage.

The exposed portion of the III-V capping layer is then etched down to the underlying III-V etch stop layer (126). A first portion of the capping layer remains under the source region and a separate second portion of the capping layer remains under the drain region. As mentioned above, the capping layer is either N-doped or P-doped. This enables the first portion of the capping layer to function as source extension region and the second portion of the capping layer to function as drain extension region. In some implementations, the etching process may recess the capping layer under the source and drain regions, thereby forming extension regions that are undercut.

FIG. 2F illustrates the trench 218 extending further down after the capping layer 208 has been etched down to the etch stop layer 206. A first portion of the capping layer 208 remains under the source region 216A to function as a source extension region 208A. And a second portion of the capping layer 208 remains under the drain region 216B to function as a drain extension region 208B. Since the QWFET shown in the figures is an NMOS device, the extension regions 208A/208B are N-doped.

Next, a high-k gate dielectric layer may be deposited into the trench (128). In implementations of the invention, the deposited gate dielectric layer functions as both a gate oxide and a thin spacer that isolates the source and drain regions from the later formed metal gate electrode. The high-k dielectric layer may be formed using materials known for their applicability in gate stacks for integrated circuit structures. In implementations of the invention, a high-k dielectric material may be chosen that has a dielectric constant (k) that is similar to or higher than the dielectric constant of the underlying III-V layer.

Some of the materials that may be used here for the dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some implementations, a laminate oxide or a composite oxide may be used. Although a few examples of materials that may be used to form high-k gate dielectric layer are described here, that layer may be made from other materials.

In some implementations of the invention, a thin transition film may be formed between the III-V layer and the high-k gate dielectric layer. This transition layer may be formed prior to deposition of the high-k dielectric material or it may form after the high-k dielectric deposition.

The high-k dielectric layer may be formed in the trench using a conventional CVD process, such as an ALD process.

In such a process, a metal oxide precursor (e.g., a metal chloride) and steam may be fed at selected flow rates into a CVD reactor, which is then operated at a selected temperature and pressure to generate an atomically smooth interface between the III-V layers and the high-k dielectric layer. The CVD reactor should be operated long enough to form a layer with the desired thickness. In most applications, the high-k dielectric layer should be less than about 60 Å thick, and more preferably between about 5 Å and about 40 Å thick. In some implementations, the high-k dielectric layer may be annealed to improve its quality.

FIG. 2G illustrates a high-k gate dielectric layer 220 formed within the trench 218. Here, the dielectric layer 220 functions as both a gate oxide atop the III-V etch stop layer 206 and as a spacer along the sidewalls of the source/drain regions 216A/B and the source/drain extension regions 208A/B. In the implementation shown in FIG. 2G, the high-k gate dielectric layer is initially deposited as a blanket layer that also covers the source/drain regions 216A/B. These portions of the dielectric layer outside of the trench may be removed at a later stage using an etching or polishing process.

Finally, at least one metal layer is deposited atop the high-k dielectric layer (130). The metal layer may be formed using any suitable conductive material from which a metal gate electrode may be derived. In some implementations, the metal layer may be deposited using PVD, ALD, or CVD processes. In other implementations, an electroplating or electroless plating process may be used to form the metal layer. Various combinations of deposition and plating processes may be used to form the metal layer.

When the metal layer will serve as an N-type workfunction metal, the metal used preferably has a workfunction that is between about 3.9 eV and about 4.2 eV. N-type materials that may be used to form the metal layer include hafnium, zirconium, titanium, tantalum, aluminum, and metal carbides that include these elements, i.e., titanium carbide, zirconium carbide, tantalum carbide, hafnium carbide and aluminum carbide. The metal layer should be thick enough to ensure that any material formed on it will not significantly impact its workfunction. Preferably, the metal layer is between about 25 Å and about 300 Å thick, and more preferably is between about 25 Å and about 200 Å thick.

When the metal layer will serve as a P-type workfunction metal, the metal used preferably has a workfunction that is between about 4.9 eV and about 5.2 eV. P-type materials that may be used to form the metal layer include ruthenium, palladium, platinum, cobalt, nickel, and conductive metal oxides, e.g., ruthenium oxide. Again, the metal layer should be thick enough to ensure that any material formed on it will not significantly impact its workfunction. Preferably, the metal layer is between about 25 Å and about 300 Å thick, and more preferably is between about 25 Å and about 200 Å thick.

In some implementations, a fill metal layer may also be deposited. The fill metal layer preferably consists of a material that may be easily polished and is preferably deposited over the entire device using a conventional metal deposition process. Such a fill metal may comprise titanium nitride, tungsten, titanium, aluminum, tantalum, tantalum nitride, cobalt, copper, nickel, or any other metal that may be polished and that may increase the thickness of the metal gate electrode being formed. Typical deposition processes for the fill metal layer may be used, such as PVD, sputtering, CVD, ALD, electroplating, and electroless plating.

FIG. 2G illustrates a work-function metal layer 222 deposited atop the high-k dielectric layer 220. The work-function metal layer 222 is deposited as a conformal blanket layer using a process such as CVD or ALD. FIG. 2G also illustrates a fill metal layer 224 deposited atop the work-function layer 222. The fill metal layer 224 fills the remainder of the trench and blankets the surface of the substrate with a metal. As mentioned above, even though FIG. 2G illustrate a dual-metal gate electrode, in some implementations a single metal layer may be used to fill the trench and provide the gate electrode.

The excess portions of the high-k dielectric layer, the work-function metal layer, and the fill metal layer may then be etched and/or polished back so that only material within the trench remains. Material overlying the source and drain regions is substantially or completely removed. The excess material may be removed using a chemical mechanical polishing (CMP) process, a dry etch process, a wet etch process, or any combination of these processes. For instance, specific removal processes may be optimal for specific layers, so a combination of these processes may be used.

FIG. 2H illustrates the QWFET device of the invention after the excess dielectric material, workfunction metal, and fill metal is removed. The metal layers 222/224 and the dielectric material 220 are confined to the trench. The metal layers 222/224 provides a metal gate electrode. The dielectric material 220 provides a gate oxide and provides spacers that isolate the gate electrode from the source/drain regions 216A/B and the source/drain extensions 208A/B. And because the source and drain regions 216A/B are self-aligned, they can be fabricated in much closer proximity to the gate electrode (i.e., metal layers 222/224) relative to conventional lithography processes.

Accordingly, an enhancement mode III-V quantum well transistor with a recessed gate structure having self-aligned source and drain regions has been shown. The use of self-aligned source and drain regions yields a device having a smaller footprint, thereby enabling a logic device to include more QWFET devices in a given area and increase the density of the QWFET devices. Furthermore, the external resistance of the self-aligned QWFET device is reduced since its source and drain regions are formed in closer proximity than the source and drain regions of a QWFET device formed using conventional lithographic processes. To demonstrate this, a conventional QWFET device formed using typical lithographic processes (i.e., not self-aligned) is shown in FIG. 3.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

The invention claimed is:

1. An apparatus comprising:
a III-V quantum well layer formed on a substrate;
a III-V barrier layer formed on the quantum well layer;
a III-V etch stop layer formed on the III-V barrier layer;
a III-V source extension region formed on the III-V etch stop layer and having a first sidewall;
a source region formed on the III-V source extension region and having a second sidewall;

a III-V drain extension region formed on the III-V etch stop layer and having a third sidewall;

a drain region formed on the III-V drain extension region and having a fourth sidewall;

a conformal high-k gate dielectric layer formed on the first, second, third, and fourth sidewalls and on a top surface of the etch stop layer; and a metal layer formed on the high-k gate dielectric layer.

2. The apparatus of claim 1, wherein the III-V quantum well layer comprises InGaAs, InSb, an inidium alloy, a gallium alloy, an arsenic alloy, an antimony alloy, InGaSb, InAs, or InAsSb.

3. The apparatus of claim 1, wherein the III-V barrier layer comprises GaAs, GaP, GaN, GaAIAs, InAlAs, or InP.

4. The apparatus of claim 1, wherein the III-V etch stop layer comprises InP.

5. The apparatus of claim 1, wherein the III-V source extension region and the III-V drain extension region comprise InGaAs or InSb.

6. The apparatus of claim 1, wherein the source region and the drain region comprise copper, aluminum, nickel, or TiW.

7. An apparatus comprising:
a III-V quantum well layer formed on a substrate;
a III-V barrier layer formed on the quantum well layer;
an InP etch stop layer formed on the III-V barrier layer;
a source stack formed atop the InP etch stop layer;
a drain stack formed atop the InP etch stop layer, wherein the source stack and the drain stack are separate by a trench;
a high-k gate dielectric layer formed on the sidewalls and bottom of the trench; and
a metal layer formed on the high-k gate dielectric layer.

8. The apparatus of claim 7, wherein the source stack comprises a source region formed atop a III-V source extension region.

9. The apparatus of claim 8, wherein the drain stack comprises a drain region formed atop a III-V drain extension region.

10. The apparatus of claim 7, wherein the III-V quantum well layer comprises InGaAs, InSb, an inidium alloy, a gallium alloy, an arsenic alloy, an antimony alloy, InGaSb, InAs, or InAsSb.

11. The apparatus of claim 7, wherein the III-V barrier layer comprises GaAs, GaP, GaN, GaAIAs, InAlAs, or InP.

12. The apparatus of claim 9, wherein the III-V source extension region and the III-V drain extension region comprise InGaAs or InSb.

13. The apparatus of claim 9, wherein the source region and the drain region comprise copper, aluminum, nickel, or TiW.

14. An apparatus comprising:
a substrate;
a III-V quantum well layer formed on the substrate;
a III-V barrier layer formed on the quantum well layer;
a III-V source extension layer formed on the III-V barrier layer and having a first sidewall;
a source region formed on the III-V source extension layer and having a second sidewall;
a III-V drain extension layer formed on the III-V barrier layer and having a third sidewall;
a drain region formed on the III-V drain extension layer and having a fourth sidewall;
a conformal high-k gate dielectric layer formed on the first, second, third, and fourth sidewalls and on a top surface of the barrier layer; and
a metal layer formed on the high-k gate dielectric layer.

15. The apparatus of claim 14, wherein the III-V quantum well layer comprises InGaAs, InSb, an inidium alloy, a gallium alloy, an arsenic alloy, an antimony alloy, InGaSb, InAs, or InAsSb.

16. The apparatus of claim 14, wherein the III-V barrier layer comprises GaAs, GaP, GaN, GaAIAs, InAlAs, or InP.

17. The apparatus of claim 14, wherein the III-V source extension region and the III-V drain extension region comprise InGaAs or InSb.

18. The apparatus of claim 14, wherein the source region and the drain region comprise copper, aluminum, nickel, or TiW.

* * * * *